(12) United States Patent
Fu et al.

(10) Patent No.: US 10,644,030 B2
(45) Date of Patent: May 5, 2020

(54) INTEGRATED CIRCUIT AND CELL STRUCTURE IN THE INTEGRATED CIRCUIT

(71) Applicant: MEDIATEK Inc., Hsin-Chu (TW)

(72) Inventors: Chuan-Shian Fu, Hsin-Chu (TW); Cheng-Jyi Chang, Zhubei (TW); Shao-Hwang Sher, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/048,418

(22) Filed: Jul. 30, 2018

(65) Prior Publication Data

US 2019/0123062 A1 Apr. 25, 2019

Related U.S. Application Data

(60) Provisional application No. 62/574,770, filed on Oct. 20, 2017.

(51) Int. Cl.
| | | |
|---|---|---|
| H01L 27/118 | (2006.01) | |
| H01L 27/092 | (2006.01) | |
| H01L 27/088 | (2006.01) | |
| H01L 29/78 | (2006.01) | |
| H01L 27/02 | (2006.01) | |

(52) U.S. Cl.
CPC .... *H01L 27/11807* (2013.01); *H01L 27/0207* (2013.01); *H01L 27/0886* (2013.01); *H01L 27/0924* (2013.01); *H01L 29/785* (2013.01); *H01L 2027/11812* (2013.01); *H01L 2027/11862* (2013.01); *H01L 2027/11866* (2013.01)

(58) Field of Classification Search
CPC ............. H01L 27/0886; H01L 27/0207; H01L 27/0924; H01L 27/118; H01L 27/11803; H01L 27/11807; H01L 29/785; H01L 2027/11809–1182
See application file for complete search history.

(56) References Cited

U.S. PATENT DOCUMENTS

| 9,026,975 B2 | 5/2015 | Song et al. |
| 2013/0126978 A1 | 5/2013 | Becker et al. |
| 2016/0098508 A1 | 4/2016 | Baek et al. |
| 2017/0033101 A1 | 2/2017 | Sharma et al. |

FOREIGN PATENT DOCUMENTS

JP 201410839 A 1/2014

OTHER PUBLICATIONS

TIPO Office Action dated Mar. 28, 2019 in Taiwan application (No. 107136829).
EPO Search Report dated Feb. 19, 2019 in EP application (No. 18187443.9-1212).

*Primary Examiner* — Alexander Sofocleous
*Assistant Examiner* — Molly K Reida
(74) *Attorney, Agent, or Firm* — McClure, Qualey & Rodack, LLP

(57) ABSTRACT

An integrated circuit includes a substrate and a plurality of standard cells. The standard cells are formed on the substrate, wherein each standard cell comprises a first fin, a second fin and a third fin, the second fin is located between the first fin and the third fin, and there is a first interval between the first fin and the second fin is different from a second interval between the first fin and the third fin.

15 Claims, 3 Drawing Sheets

ID STATES PATENT

INTEGRATED CIRCUIT AND CELL STRUCTURE IN THE INTEGRATED CIRCUIT

This application claims the benefit of U.S. Provisional application Ser. No. 62/574,770, filed Oct. 20, 2017, the disclosure of which is incorporated by reference herein in its entirety.

FIELD OF THE INVENTION

The invention relates to an integrated circuit and a cell structure in the integrated circuit, and more particularly to an integrated circuit having at least one standard cell and a cell structure in the integrated circuit.

BACKGROUND OF THE INVENTION

Conventional integrated circuit includes at least one transistor, and each transistor includes a number of fins, wherein an interval between any two fins is equal. However, such mode causes less flexibility for kinds of cell design.

SUMMARY OF THE INVENTION

In one embodiment of the invention, an integrated circuit is provided. The integrated circuit includes a substrate and a plurality of standard cells. The standard cells are formed on the substrate, wherein each standard cell comprises a first fin, a second fin and a third fin, the second fin is located between the first fin and the third fin, and there is a first interval between the first fin and the second fin is different from a second interval between the first fin and the third fin.

In another embodiment of the invention, a cell structure in an integrated circuit is provided. The cell structure includes a first fin, a second fin and a third fin disposed on a substrate. The second fin is located between the first fin and the third fin, and there is a first interval between the first fin and the second fin is different from a second interval between the first fin and the third fin.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
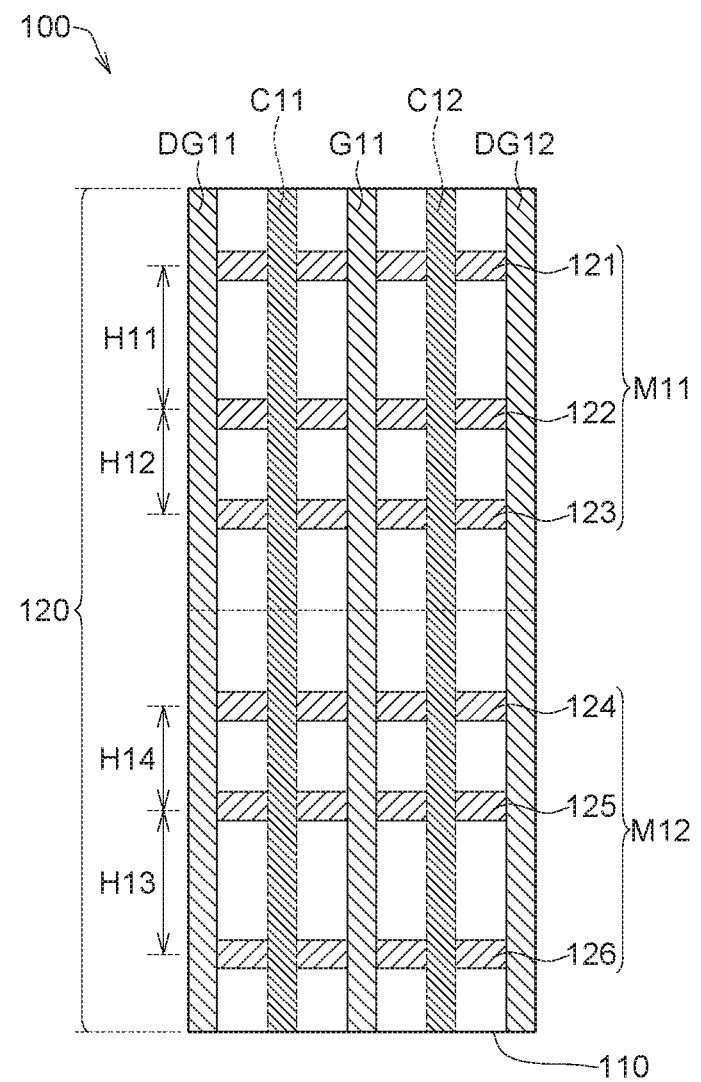
FIG. 1 illustrates a top view of an integrated circuit according to an embodiment of the invention.

FIG. 1 illustrates a top view of an integrated circuit 100 according to an embodiment of the invention.

The integrated circuit 100 includes a substrate 110 and a plurality of standard cells 120 (FIG. 1 only shows one standard cell). One standard cell refers to the minimum unit in integrated circuit 100 or circuit design stage, and it can be a transistor, a switch, a passive component, a chip, etc. The transistor is, for example, Fin Field-effect transistor (Fin-FET).

Furthermore, a standard cell is, for example, a group of transistor and interconnect structures that provides a boolean logic function (e.g., AND, OR, XOR, XNOR, inverters) or a storage function (flipflop or latch). The simplest cells are direct representations of the elemental NAND, NOR, and XOR boolean function, although cells of much greater complexity are commonly used (such as a 2-bit full-adder, or muxed D-input flipflop.) The cell's boolean logic function is called its logical view: functional behavior is captured in the form of a truth table or Boolean algebra equation (for combinational logic), or a state transition table (for sequential logic).

Usually, the initial design of a standard cell is developed at the transistor level, in the form of a transistor netlist or schematic view. The netlist is a nodal description of transistors, of their connections to each other, and of their terminals (ports) to the external environment. A schematic view may be generated with a number of different Computer Aided Design (CAD) or Electronic Design Automation (EDA) programs that provide a Graphical User Interface (GUI) for this netlist generation process. Designers use additional CAD programs such as SPICE or Spectre to simulate the electronic behavior of the netlist, by declaring input stimulus (voltage or current waveforms) and then calculating the circuit's time domain (analogue) response. The simulations verify whether the netlist implements the desired function and predict other pertinent parameters, such as power consumption or signal propagation delay.

Each standard cell 120 is formed on the substrate 110, wherein each standard cell 120 includes a first fin 121, a second fin 122, a third fin 123, a fourth fin 124, a fifth fin 125, a sixth fin 126, a first gate line G11, a first dummy gate line DG11 and a second dummy gate line DG12. Each fin includes a source region (not illustrated) and a drain region (not illustrated) located adjacent to two opposite sides of the first gate line G11.

The first gate line G11 connects the first fin 121, the second fin 122, the third fin 123, the fourth fin 124, the fifth fin 125 and the sixth fin 126. The first dummy gate line DG11 and the second dummy gate line DG12 also connect first fin 121, the second fin 122, the third fin 123, the fourth fin 124, the fifth fin 125 and the sixth fin 126, but the first dummy gate line DG11 and the second dummy gate line DG12 are not connected with the first gate G11. The first dummy gate line DG11 and the second dummy gate line DG12 may be made of a material the same as that of the first gate line G11 in the same manufacturing process, for example.

Each standard cell 120 further includes a first transistor M11 and a second transistor M12. The first transistor M11 includes the first fin 121, the second fin 122, the third fin 123 and a part of the first gate line G1, and the second transistor M12 includes the fourth fin 124, the fifth fin 125, the sixth fin 126 and another part (or the other) of the first gate line G11.

The second fin 122 is located between the first fin 121 and the third fin 123, and there is a first interval H11 between the first fin 121 and the second fin 122 is different from a second interval H12 between the first fin 121 and the third fin 123. The fifth fin 125 is located between the fourth fin 124 and the sixth fin 126, and there is a third interval H13 between the fifth fin 125 and the sixth fin 126 is different from the fourth interval H14 between the fourth fin 124 and the fifth fin 125. It can be understood that, in the present embodiment, there are several different intervals among a number of the fins in one transistor, and thus it can increase design flexibility, relax rules and prevent the electrical short-circuit by increasing the interval between two fins.

In addition, one of the first transistor M11 and the second transistor M12 may be PMOS, and another of the first transistor M11 and the second transistor M12 may be NMOS. Alternatively, each of the first transistor M11 and the second transistor M12 may be PMOS or NMOS. In addition, the first transistor M11 and/or the second transistor M12 may be electrically connected with a circuit (not illustrated) through the contacts C11 and/or C12. The contacts C11 and/or C12 may be included in the standard cell 120 or in the integrated circuit 100.

In one embodiment, as shown in FIG. 1, both fin edges of each fins, such as the first fin 121, the second fin 122, the third fin 123, the fourth fin 124, the fifth fin 125 and the sixth fin 126, are covered by the first dummy gate line DG11 and the second dummy gate line DG12, that is to say, fin edges of each fins will not extend beyond the first dummy gate line DG11 and the second dummy gate line DG12.

Figure 2:
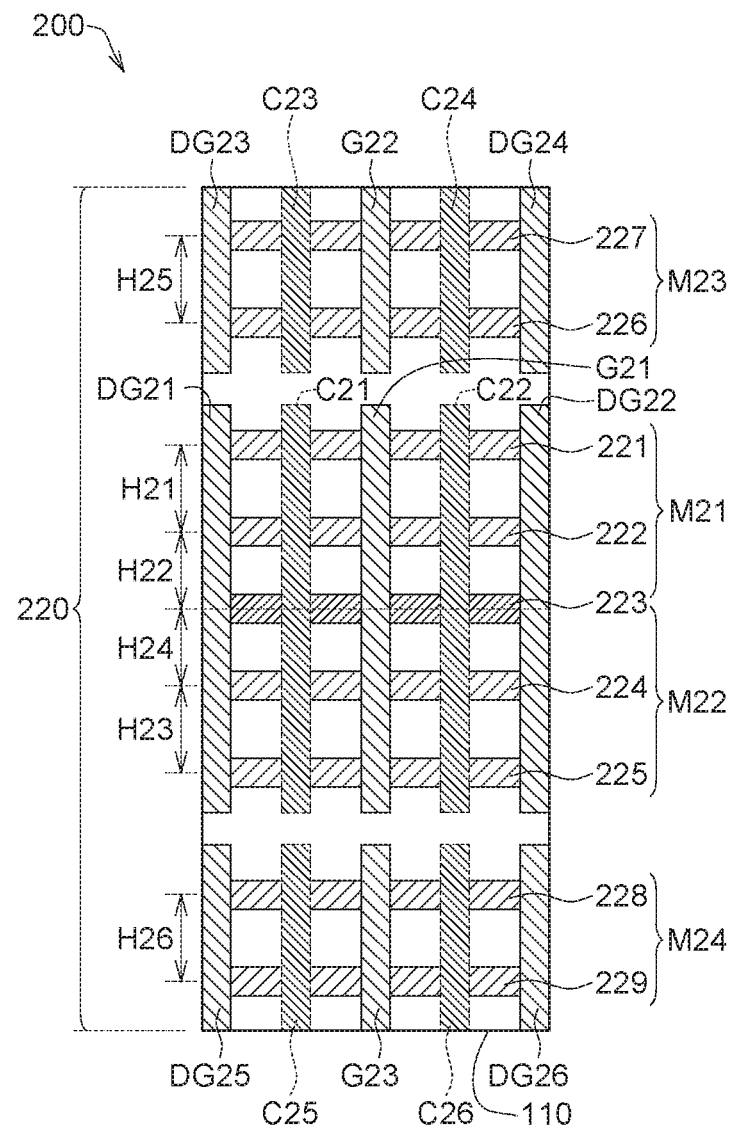
FIG. 2 illustrates a top view of an integrated circuit according to another embodiment of the invention.

FIG. 2 illustrates a top view of an integrated circuit 200 according to another embodiment of the invention.

The integrated circuit 200 includes the substrate 110 and a plurality of standard cells 220 (FIG. 2 only shows one standard cell). Each standard cell 220 is formed on the substrate 110, wherein each standard cell 220 includes a first fin 221, a second fin 222, a third fin 223, a fourth fin 224, a fifth fin 225, a sixth fin 226, a seventh fin 227, an eighth fin 228, a ninth fin 229, a first gate line G21, a second gate line G22, a third gate line G23, a first dummy gate line D21, a second dummy gate line DG22, a third dummy gate line DG23, a fourth dummy gate line DG24, a fifth dummy gate line DG25 and a sixth dummy gate line DG26. Each fin includes a source region (not illustrated) and a drain region (not illustrated) located adjacent to two opposite sides of the corresponding gate line G21, G22 or G23.

The first gate line G21 connects the first fin 221, the second fin 222, the third fin 223, the fourth fin 224 and the fifth fin 225. The first dummy gate line DG21 and the second dummy gate line DG22 also connect the first fin 221, the second fin 222, the third fin 223, the fourth fin 224 and the fifth fin 225, but the first dummy gate line DG21 and the second dummy gate line DG22 are not connected with the first gate line G21. The first dummy gate line DG21 and the second dummy gate line DG22 may be made of a material the same as that of the first gate line G21 in the same manufacturing process, for example.

The second gate line G22 connects the sixth fin 226 and the seventh fin 227. The third dummy gate line DG23 and the fourth dummy gate line DG24 also connect the sixth fin 226 and the seventh fin 227, but are not electrically connected with the second gate line G22. The third dummy gate line DG23 and the fourth dummy gate line DG24 may be made of a material the same as that of the second gate line G22 in the same manufacturing process, for example.

The third gate line G23 connects the eighth fin 228 and the ninth fin 229. The fifth dummy gate line DG25 and the sixth dummy gate line DG26 also connect the eighth fin 228 and the ninth fin 229, but are not electrically connected with the third gate line G23. The fifth dummy gate line DG25 and the sixth dummy gate line DG26 may be made of a material the same as that of the third gate line G23 in the same manufacturing process, for example.

In addition, the second gate line G22 is not directly connected with the first gate line G21 or/and the third gate line G23, but the second gate line G22 may be electrically connected to the first gate line G21 through contacts C23/C24 and contacts C21/C22, and/or the second gate line G22 may be electrically connected to the third gate line G23 through contact C23/C24 and C25/C26. The contacts C21, C22, C23, C24, C25 and C26 may be included in the standard cell 220 or in the integrated circuit 200. Alternatively, at least two of the first gate line G21, the second gate line G22 and the third gate line G23 are electrically separated from each other.

Each standard cell 220 further includes a first transistor M21, a second transistor M22, a third transistor M23 and a fourth transistor M24. In addition, the third transistor M23 is not directly connected with the first transistor M21 (or the second transistor M22) or/and the fourth transistor M24, but the third transistor M23 may be electrically connected to the first transistor M21 (or the second transistor M22) through contact C23/C24 and C21/C22, and/or the third transistor M23 may be electrically connected the fourth transistor M24 through at contact C23/C24 and C25/C26. Alternatively, at least two of the first transistor M21 (or the second transistor M22), the third transistor M23 and the fourth transistor M24 are electrically separated from each other. In another embodiment, the first transistor M21 and the second transistor M22 may be integrated into one transistor, for example, PMOS or NMOS.

In one embodiment, the first transistor M21 and the second transistor M22 both are, for example, NMOS or PMOS. The third transistor M23 and/or the fourth transistor M24 is, for example, NMOS or PMOS.

The first transistor M21 includes the first fin 221, the second fin 222, the third fin 223 and a part of the first gate line G21, the second transistor M22 includes the third fin 223, the fourth fin 224, the fifth fin 225 and another part of the first gate line G11. The first transistor M21 and the second transistor M22 share the same fin, for example, the third fin 223. In addition, the sum of the number of the fins of the first transistor M21 and the number of the fins of the second transistor M22 may be odd or even. In compared with the first transistor including four fins, five fins can provide larger current amount. For example, five fins of the first transistor M21 and the second transistor M22 can increase 5/4 times the amount of current in compared with four fins.

The second fin 222 is located between the first fin 121 and the third fin 123, and there is a first interval H21 between the first fin 221 and the second fin 222 is different from or equal to a second interval H22 between the first fin 221 and the third fin 223. The fourth fin 224 is located between the third fin 223 and the fifth fin 225, and there is a third interval H23 between the fourth fin 224 and the fifth fin 225 is different from or equal to a fourth interval H24 between the third fin 223 and the fourth fin 224. In an embodiment, the first interval H21 may be different from or equal to the third interval H23, and the second interval H22 may be different from or equal to the fourth interval H24. In another embodiment, the sum of the second interval H22 and the fourth interval H24 may be different from or equal to the sum of the first interval H21 and the third interval H23. It can be understood that, in the present embodiment, there are several different intervals of a number of the fins in one transistor.

There is a fifth interval H25 between the sixth fin 226 and the seventh fin 227, and the fifth interval H25 may be different from or equal to any of the first interval H21 to the fourth interval H24. There is a sixth interval H26 between the eighth fin 228 and the ninth fin 229, and the sixth interval H26 may be different from or equal to any of the first interval H21 to the fourth interval H24. In addition, the fifth interval H25 and the sixth interval H26 may be the equal or different.

It can be understood that, in the present embodiment, there are several different intervals among a number of the fins in one transistor, and thus it can increase design flexibility, relax rules and prevent the electrical short-circuit by increasing the interval between two fins.

As illustrated in FIG. 2, in one standard cell 220, there are four transistors. However, in another embodiment, the standard cell 220 may include more the first transistors M21, the second transistors M22, the third transistors M23 and/or the fourth transistors M24. In addition, at least two of the first transistors M21, the second transistors M22 (or the third transistors M23) and the fourth transistors M24 may be electrically separated from each other, or electrically connected with each other through two contacts.

Figure 3:
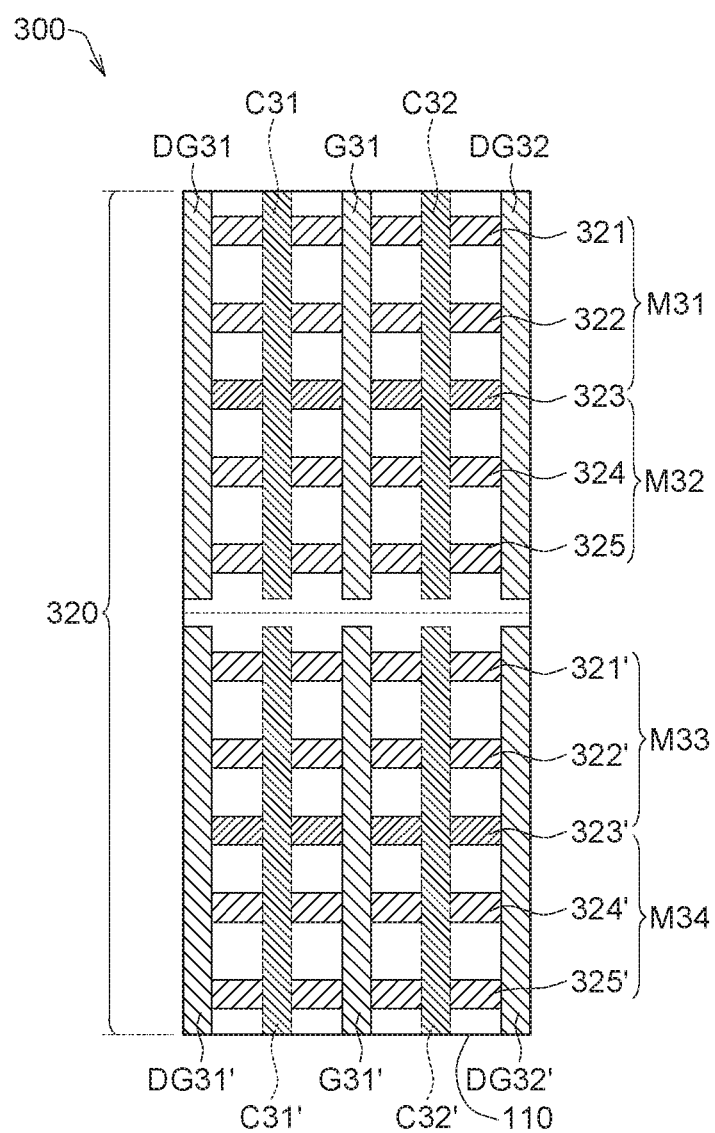
FIG. 3 illustrates a top view of an integrated circuit according to another embodiment of the invention.

FIG. 3 illustrates a top view of an integrated circuit 300 according to another embodiment of the invention.

The integrated circuit 300 includes the substrate 110 and a plurality of standard cells 320 (FIG. 3 only shows one standard cell). Each standard cell 320 is formed on the substrate 110, wherein each standard cell 320 includes a first fin 321, a second fin 322, a third fin 323, a fourth fin 324, a fifth fin 325, a first gate line G31, a first dummy gate line DG31, a second dummy gate line DG32, a first fin 321', a second fin 322', a third fin 323', a fourth fin 324', a fifth fin 325', a first gate line G31', a first dummy gate line DG31' and a second dummy gate line DG32'. Each fin includes a source region (not illustrated) and a drain region (not illustrated) located adjacent to two opposite sides of the corresponding gate line G31 or G31'.

The first gate line G31 connects the first fin 321, the second fin 322, the third fin 323, the fourth fin 324 and the fifth fin 325. The first dummy gate line DG31 and the second dummy gate line DG32 also connect the first fin 321, the second fin 322, the third fin 323, the fourth fin 324 and the fifth fin 325, but the first dummy gate line DG31 and the second dummy gate line DG32 are not connected with the first gate line G31. The first dummy gate line DG31 and the second dummy gate line DG32 may be made of a material the same as that of the first gate line G31 in the same manufacturing process, for example.

The first gate line G31' connects the first fin 321', the second fin 322', the third fin 323', the fourth fin 324' and the fifth fin 325'. The first dummy gate line DG31' and the second dummy gate line DG32' also connect the first fin 321', the second fin 322', the third fin 323', the fourth fin 324' and the fifth fin 325', but the first dummy gate line DG31' and the second dummy gate line DG32' are not connected with the first gate line G31'. The first dummy gate line DG31' and the second dummy gate line DG32' may be made of a material the same as that of the first gate line G31' in the same manufacturing process, for example.

The first gate line G31 is not directly connected with the first gate line G31', but the first gate line G31 may be electrically connected with the first gate line G31' through contact C31/C32 and C31'/C32'. The contacts C31, C32, C31' and C32' may be included in the standard cell 320 or in the integrated circuit 300.

Each standard cell 320 further includes a first transistor M31, a second transistor M32, a third transistor M33 and a fourth transistor M34. The first transistor M31 (or the second transistor M32) is not directly connected with the third transistor M33 (or the fourth transistor M34), but the first transistor M31 (or the second transistor M32) may be electrically connected to the third transistor M33 (or the fourth transistor M34) through the contact C31/C32 and C31'/C32'. Alternatively, the first transistor M31 (or the second transistor M32) and the third transistor M33 (or the fourth transistor M34) may be electrically separated from each other.

In one embodiment, the first transistor M31 and the second transistor M32 both are, for example, NMOS or PMOS. The third transistor M33 and the fourth transistor M34 both are, for example, NMOS or PMOS.

The first transistor M31 includes the first fin 321, the second fin 322, the third fin 323 and a part of the first gate line G31, the second transistor M32 includes the third fin 323, the fourth fin 324, the fifth fin 325 and another part of the first gate line G31. The first transistor M31 and the second transistor M32 share the same fin, for example, the third fin 323. The third transistor M33 includes the first fin 321', the second fin 322', the third fin 323' and a part of the first gate line G31', the fourth transistor M34 includes the third fin 323', the fourth fin 324', the fifth fin 325' and another part of the first gate line G31'. The third transistor M33 and the fourth transistor M34 share the same fin, for example, the third fin 323'.

The intervals among the fins of the first transistor M31 and the second transistor M32 are similar to or the same as that of the first transistor M21 and the fourth transistor M22 of FIG. 2. Similarly, the intervals among the fins of the third transistor M33 and the fourth transistor M34 may be similar to or the same as that of the first transistor M31 and the second transistor M32.

It can be understood that, in the present embodiment, there are several different intervals among a number of the fins in one transistor, and thus it can increase design flexibility and prevent the electrical short-circuit by increasing the interval between two fins. In addition, opposite two edges of each fin of each of the integrated circuits 100, 200 and 300 are covered by two dummy gate lines, respectively. That is, opposite two edges of each fin of each of the integrated circuits 100, 200 and 300 do not extend beyond the two dummy gate lines.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit, comprises:
   a substrate; and
   a plurality of standard cells formed on the substrate, wherein each standard cell comprises a first fin, a second fin and a third fin, the second fin is located between the first fin and the third fin, and there is a first interval between the first fin and the second fin that is different from a second interval between the second fin and the third fin;
   wherein each standard cell further comprises a fourth fin and a fifth fin, the fourth fin is located between the third fin and the fifth fin, and there is a third interval between the fourth fin and the fifth fin that is different from a fourth interval between the third fin and the fourth fin;
   wherein the first interval is equal to the third interval, and the second interval is equal to the fourth interval.

2. The integrated circuit according to claim 1, wherein each standard cell comprises a first gate line connecting the first fin, the second fin and the third fin.

3. The integrated circuit according to claim 1, wherein the each standard cell comprises two transistors, one of the two transistors comprises the first fin, the second fin and the third fin, and another of the two transistors comprises the third fin, the fourth fin and the fifth fin.

4. The integrated circuit according to claim 1, wherein the each standard cell comprises two transistors, the two transistors share the third fin.

5. The integrated circuit according to claim 4, wherein each of the two transistors is PMOS or NMOS.

6. The integrated circuit according to claim 2, wherein each standard cell comprises a sixth fin, a seventh fin and a second gate line connecting the sixth fin and the seventh fin, and the second gate line does not connect the first gate line.

7. The integrated circuit according to claim 6, wherein each standard cell comprises an eighth fin, a ninth fin and a third gate line connecting the eighth fin and the ninth fin, and the third gate line does not connect the first gate line.

8. The integrated circuit according to claim 1, wherein the each standard cell comprises a first transistor, a second transistor, a third transistor and a fourth transistor, the first transistor comprises the first fin, the second fin and the third fin, the second transistor comprises the third fin, the fourth fin and the fifth fin, the third transistor comprises another first fin, another second fin and another third fin, and the fourth transistor comprises another third fin, another fourth fin and another fifth fin.

9. A cell structure in an integrated circuit, comprises:
a first fin, a second fin and a third fin disposed on a substrate;
wherein the second fin is located between the first fin and the third fin, and there is a first interval between the first fin and the second fin that is different from a second interval between the second fin and the third fin;
wherein each standard cell further comprises a fourth fin and a fifth fin, the fourth fin is located between the third fin and the fifth fin, and there is a third interval between the fourth fin and the fifth fin that is different from a fourth interval between the third fin and the fourth fin;
wherein the first interval is equal to the third interval, and the second interval is equal to the fourth interval.

10. The cell structure according to claim 9, further comprises:
a first gate line connecting the first fin, the second fin and the third fin.

11. The cell structure according to claim 9, comprises two transistors, wherein one of the two transistors comprises the first fin, the second fin and the third fin, and another of the two transistors comprises the third fin, the fourth fin and the fifth fin.

12. The cell structure according to claim 9, comprises two transistors, wherein the two transistors share the second fin.

13. The cell structure according to claim 10, comprising:
a sixth fin, a seventh fin and a second gate line connecting the sixth fin and the seventh fin, and the second gate line does not connect the first gate line.

14. The cell structure according to claim 13, comprising:
an eighth fin, a ninth fin and a third gate line connecting the eighth fin and the ninth fin, wherein the third gate line does not connect the first gate line.

15. The cell structure according to claim 9, comprising: a first transistor, a second transistor, a third transistor and a fourth transistor, the first transistor comprises the first fin, the second fin and the third fin, the second transistor comprises the third fin, the fourth fin and the fifth fin, the third transistor comprises another first fin, another second fin and another third fin, and the fourth transistor comprises another third fin, another fourth fin and another fifth fin.

* * * * *